(12) United States Patent
Chien

(10) Patent No.: US 9,312,180 B2
(45) Date of Patent: Apr. 12, 2016

(54) METHOD FOR FORMING SEMICONDUCTOR STRUCTURE

(71) Applicant: UNITED MICROELECTRONICS CORP., Hsin-Chu (TW)

(72) Inventor: Chin-Cheng Chien, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/461,444

(22) Filed: Aug. 18, 2014

(65) Prior Publication Data

US 2016/0027699 A1    Jan. 28, 2016

(30) Foreign Application Priority Data

Jul. 23, 2014    (CN) .......................... 2014 1 0352445

(51) Int. Cl.
*H01L 21/8242* (2006.01)
*H01L 21/8234* (2006.01)
*H01L 29/66* (2006.01)
*H01L 29/78* (2006.01)

(52) U.S. Cl.
CPC ... *H01L 21/823431* (2013.01); *H01L 21/823418* (2013.01); *H01L 29/66636* (2013.01); *H01L 29/7848* (2013.01)

(58) Field of Classification Search
CPC .............................................. H01L 21/823431
See application file for complete search history.

(56) References Cited

U.S. PATENT DOCUMENTS

| 2011/0210393 | A1 | 9/2011 | Chen | |
|---|---|---|---|---|
| 2013/0093026 | A1* | 4/2013 | Wann et al. | 257/401 |
| 2013/0140637 | A1 | 6/2013 | Chang | |
| 2014/0353760 | A1* | 12/2014 | Loubet et al. | 257/369 |
| 2015/0091059 | A1* | 4/2015 | Hung et al. | 257/192 |
| 2015/0091099 | A1* | 4/2015 | Ching et al. | 257/401 |
| 2015/0115334 | A1* | 4/2015 | Liaw | 257/288 |

* cited by examiner

*Primary Examiner* — Angel Roman
(74) *Attorney, Agent, or Firm* — Winston Hsu; Scott Margo

(57) ABSTRACT

The present invention provides a method for forming a semiconductor structure, including the following steps: Firstly, a substrate is provided, the substrate has a first region defined thereon, a plurality of fin structure is disposed within the first region, and an insulating layer is disposed on the substrate and between each fin structure; next, a first material layer is then formed on the insulating layer, and the fin structures is exposed simultaneously, afterwards, the fin structure is partially removed, and an epitaxial layer is then formed on the top surface of each remained fin structure.

12 Claims, 5 Drawing Sheets

METHOD FOR FORMING SEMICONDUCTOR STRUCTURE

BACKGROUND OF THE INVENTION

1. Field of the Invention

The present invention generally relates to semiconductor structures, and more particular to method for forming a semiconductor structure with an epitaxial layer, and the epitaxial layer does not contact others adjacent epitaxial layers.

2. Description of the Prior Art

With the trend in the industry being towards scaling down the size of metal oxide semiconductor transistors (MOS), three-dimensional or non-planar transistor technology, such as the fin field effect transistor technology (Fin FET) has been developed to replace planar MOS transistors. The three-dimensional structure of a fin FET increases the overlapping area between the gate and the fin-shaped structure of the silicon substrate, and, accordingly, the channel region is more effectively controlled. The drain-induced barrier lowering (DIBL) effect and short channel effect (SCE) are therefore reduced. The channel region is also longer under the same gate length, and thus the current between the source and the drain is increased.

In another aspect, in order to further improve device performance, a strained-silicon technology has also been developed. The main principle in the strained-silicon technology is that strains are applied to predetermined regions within the semiconductor device which in turn make the semiconductor device work better by enabling charge carriers, such as electrons or holes, to pass through the lattice of the channel more easily. In detail, one main technology generally used in the strained-silicon technology is to dispose epitaxial structures with lattice constants different from that of the crystal silicon in the source/drain regions of the semiconductor devices. The epitaxial structures are preferably composed of silicon germanium (SiGe), carbon-doped silicon (SiC) and so forth, which have lattice constants different from that of the crystal silicon. Since the epitaxial structures have lattice constants larger or smaller than that of the crystal silicon, carrier channel regions adjacent to those epitaxial structures could sense external stresses and both the lattice structure and the band structure within these regions are altered. As a result, the carrier mobility and the performances of the corresponding semiconductor devices are improved effectively.

However, along with the continuous decrease in the size and dimensions of the semiconductor devices, there are still some newly generated technological problems that need to be overcome, even though the non-planar transistor and the strained-silicon technology are already adopted. For example, two adjacent epitaxial structures within the semiconductor device often generate unwanted lattice defects on their interfaces. Therefore, how to effectively eliminate these defects and improve the performance of the semiconductor devices are important issues in this field.

SUMMARY OF THE INVENTION

The present invention provides a method for forming a semiconductor structure, at least comprising the following steps: Firstly, a substrate is provided, the substrate has a first region defined thereon, a plurality of fin structure is disposed within the first region, and an insulating layer is disposed on the substrate and between each fin structure; next, a first material layer is then formed on the insulating layer, and the fin structures is exposed simultaneously, afterwards, the fin structure is partially removed, and an epitaxial layer is then formed on the top surface of each remained fin structure.

In summary, the feature of the present invention is further forming a photoresist layer during the manufacturing process, the photoresist layer can adjust the height difference between the fin structure and the insulating layer, to make the top surface of the fin structure lower than the top surface of the insulating layer, and a trench is then defined by the fin structure and the insulating layer, since the following formed epitaxial layer is formed in the trench, the epitaxial layer at least has a portion disposed in the trench, decreasing the possibility to contact the others adjacent epitaxial layer, and increasing the yield of the manufacturing process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
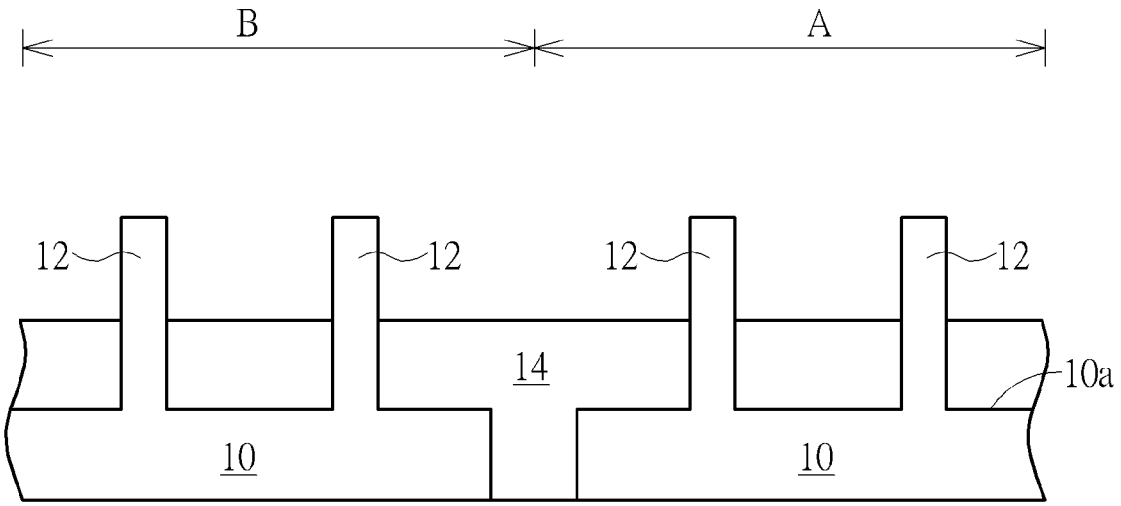
FIG. 1 to FIG. 9 are schematic diagrams showing a method for fabricating a semiconductor device according to a first preferred embodiment of the present invention.

FIG. 1 to FIG. 9 are schematic diagrams showing a method for fabricating a semiconductor device according to a first preferred embodiment of the present invention. Please refer to FIG. 1. FIG. 1 is a schematic diagram showing a semiconductor device at the beginning of the fabrication process. As this stage, a semiconductor device having a substrate 10 and a plurality of fin structures 12 disposed thereon is provided. The main surface 10a of the substrate may have a specific orientation and the long axial direction of each fin structure 12 is aligned with a predetermined direction. For example, for a bulk silicon substrate, the main surface 10a of the substrate may have an orientation (100) and the long axial direction of each fin structure 12 is aligned with a direction (110), but not limited thereto. In addition to the bulk silicon substrate, the substrate 10 may be chosen from another semiconductor substrate such as a silicon containing substrate, a III-V semiconductor-on-silicon (such as GaAs-on-silicon) substrate, a graphene-on-silicon substrate, a silicon-on-insulator (SOI) substrate, a silicon dioxide substrate, an aluminum oxide substrate, a sapphire substrate, a germanium containing substrate or an alloy of silicon and germanium substrate.

More precisely, the method for fabricating the fin-shaped structures 12 may include the following processes, but not limited thereto. First, a bulk substrate (not shown) is provided and a hard mask layer (not shown) is formed thereon. The hard mask layer is then patterned through a photolithographic and an etching process, so as to define the location for forming fin structures 12 in the bulk substrate. Afterwards, an etching process is performed to form fin structures 12 in the bulk substrate. After the above processes, the fabrication method for the fin structures 12 is complete. In this case, the fin structures 12 may be regarded as protruding from the surface 10a of the substrate 10 and the compositions of the fin structures 12 and the substrate 10 may be the same, such as monocrystalline silicon. In another case, when the substrate is chosen from a III-V semiconductor-on-silicon substrate rather than the above-mentioned bulk silicon substrate, the main compositions of the fin-shaped structures may be the same as that of the III-V semiconductor and differ from that of the underlying substrate.

In this embodiment, an insulating layer 14 is disposed between every two adjacent fin structures 12, such as a shallow trench isolation (STI), which can be formed through a STI process or others suitable processes, it is a well-known technology and will not be redundantly described here. Afterwards, a first region A and a second region B are defined on the substrate 10, in this embodiment, the first region A such as a PMOS region of a semiconductor device, and the second region B such as a NMOS region of a semiconductor device. In the following steps, an epitaxial layer will be formed within both first region A and second region B. In order to simplify the description, the present invention only describes the manufacturing process until the epitaxial layer is formed within the first region A.

Figure 2:
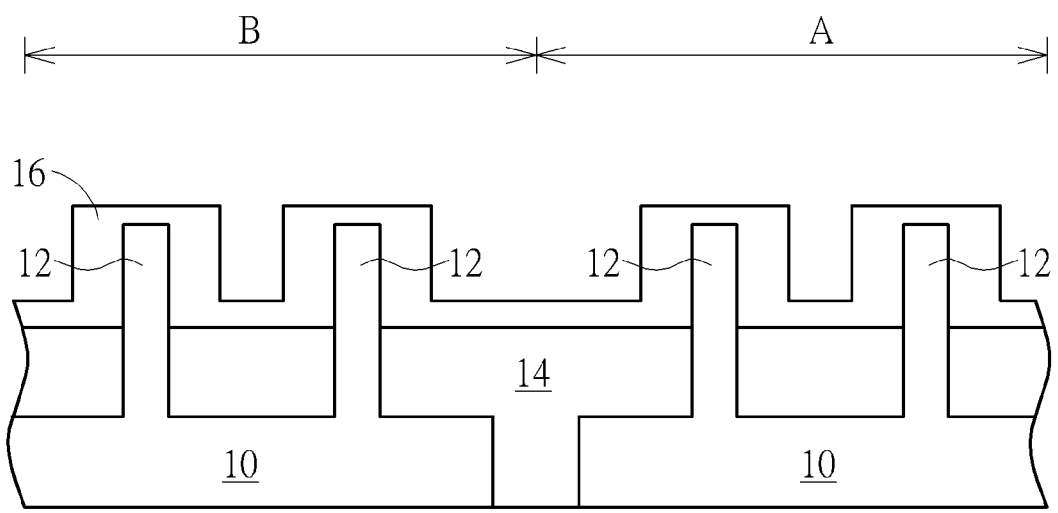
Figure 3:
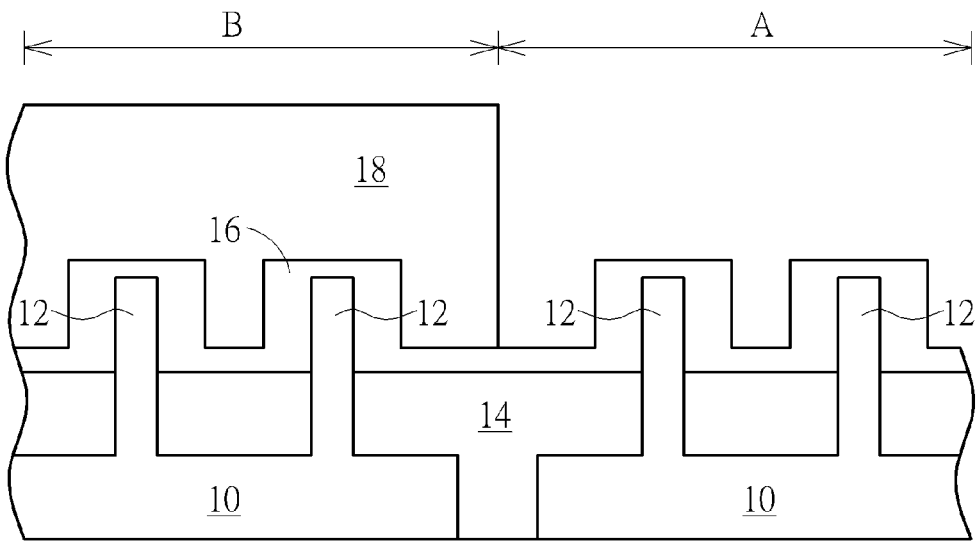
Figure 4:
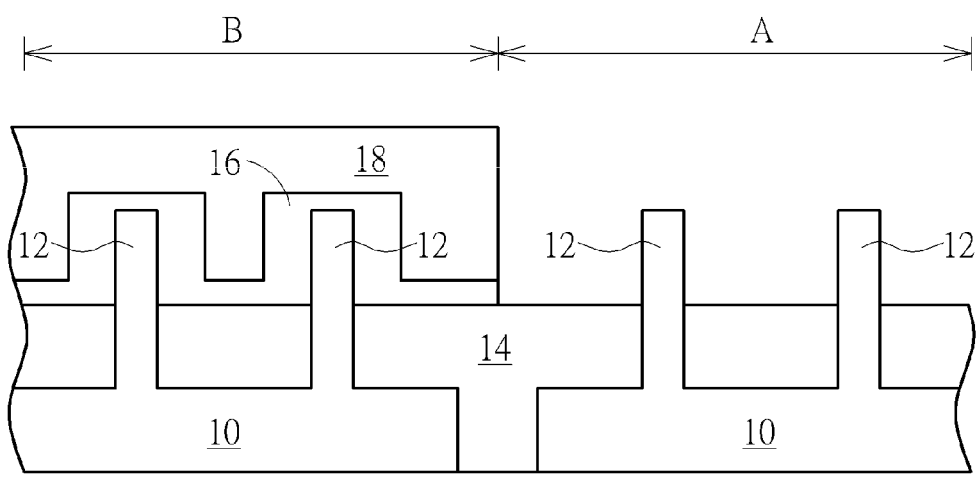

Next, as shown in FIGS. 2-4, a patterned cap layer is formed on the substrate 10, which includes an insulating layer or a conductive layer. In this embodiment, the cap layer is a dielectric layer 16, which is entirely formed to cover the fin structure 12 and the insulating layer 14 within the first region A and the second region B, wherein the dielectric layer 16 such as a silicon oxide layer, a silicon nitride layer or other suitable materials. Afterwards, as shown in FIG. 3, a material layer, such as a photoresist layer 18 is formed only within the second region B, so the photoresist layer 18 only protects the dielectric layer 16 within the second region B. As shown in FIG. 4, an etching process is performed, to remove the dielectric layer 16 within the first region A, since the dielectric layer 16 within the second region B is still protected by the photoresist layer 18, so the dielectric layer 16 within the second region B will not be removed.

Figure 5:
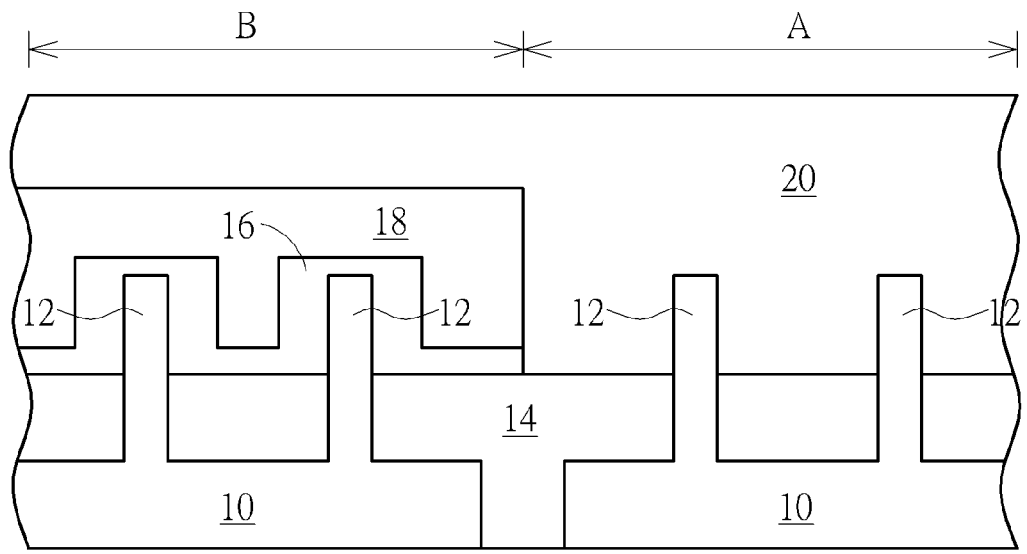
Figure 6:
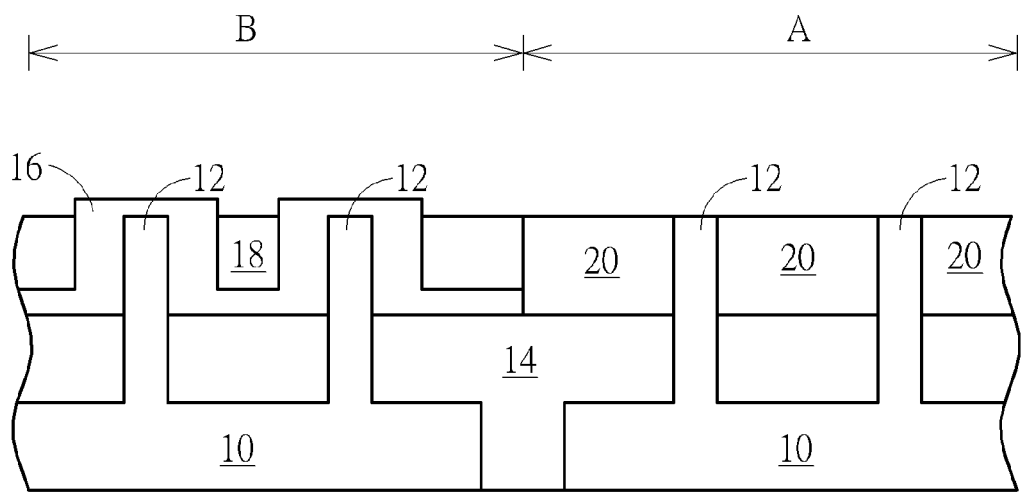

Please refer to FIGS. 5-8, as shown in FIG. 5, another material layer, such as a photoresist layer 20 which has the same or similar etching rate to the photoresist layer 18 has, is entirely formed in the first region A and the second region B. In other words, the photoresist layer 20 is formed on the fin structure 12 and on the insulating layer 14 within the first region A, and formed on the photoresist layer 18 within the second region B. As shown in FIG. 6, another etching process is performed, in this step, choosing the solvent or gas which has faster etching rate for photoresist layer, to remove parts of the photoresist layer 18 and parts of the photoresist layer 20 within the first region A and within the second region B. More precisely, since the fin structure 12 within the first region A is covered by the photoresist layer 20, therefore, after the etching process is performed, the top surface of the fin structure 12 within the first region A has exposed, and on the other hand, the fin structure within the second region B still covered by the dielectric layer 16, so the fin structure within the second region B will not be exposed in this step. It is noteworthy that in this embodiment, the material of the photoresist layer 18 and the photoresist layer 20 may be same or different, but both the photoresist layer 18 or the photoresist layer 20 compared to the dielectric layer 16 have etching selectivity, in other words, the etching rate for etching the photoresist layer 18 or the photoresist layer 20 is different from the etching rate for etching the dielectric layer 16, the etching selectivity mentioned above means satisfying the following situation: when the top surface of the fin structure 12 within the first region A is exposed after the etching process is performed, the dielectric layer 16 within the second region B still covers the fin structure 12. Maybe the dielectric layer 16 is lightly etched, but the fin structure 12 within the second region B will not be exposed.

Figure 7:
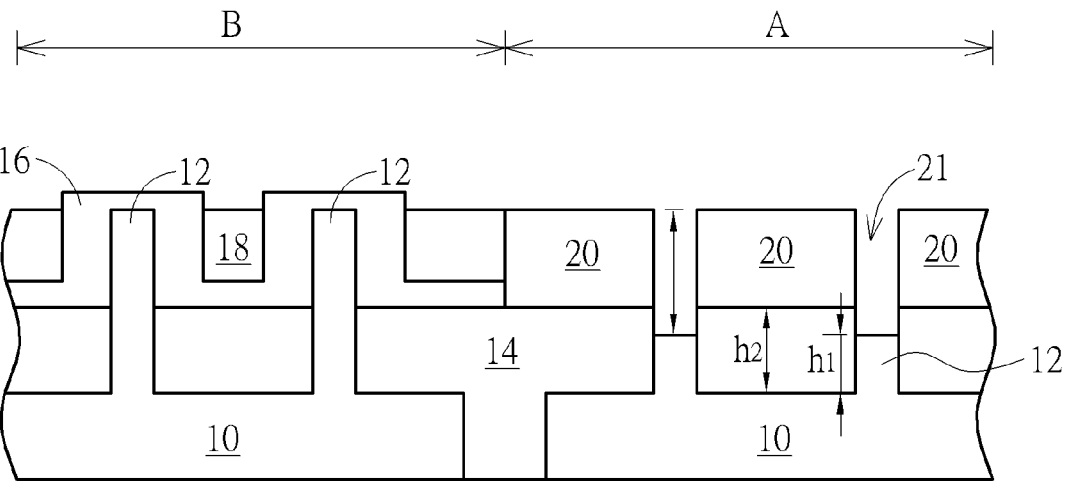
Figure 8:
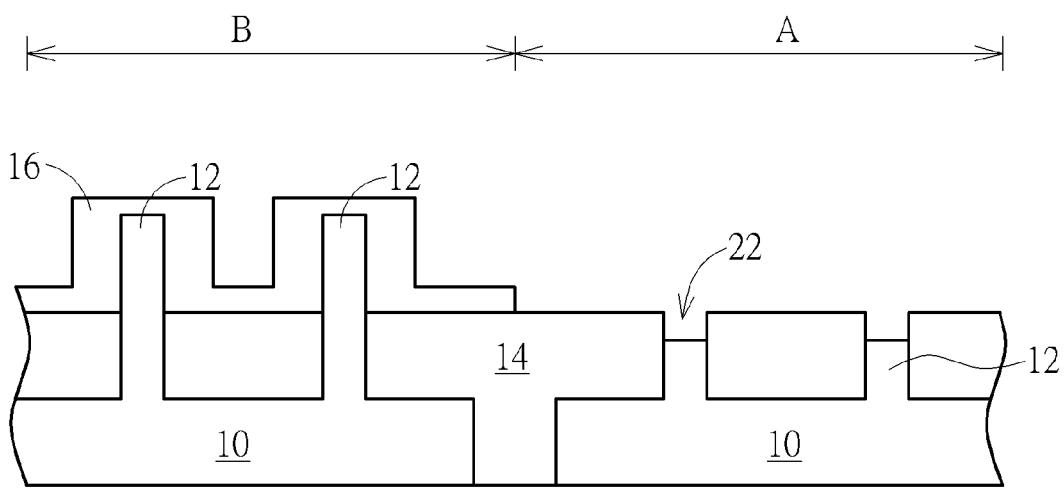

As shown in FIGS. 7-8, while the material layer (the photoresist layer 20) still covers the insulating layer 14, an etching process is performed, to partially remove the exposed fin structure 12 within the first region A, at this step, since the top surface of the fin structure 12 is lower than the top surface of the insulating layer 14 and the photoresist layer 20, therefore, a trench 21 is defined by the top surface of the fin structure 12, the sidewalls of the insulating layer 14 and the sidewalls of photoresist layer 20. Next, as shown in FIG. 8, the photoresist layer 18 and the photoresist layer 20 within the first region A and the second region B are removed simultaneously. Take this embodiment as an example, since the photoresist layer 18 and the photoresist layer 20 are similar material, so the photoresist layer 18 and the photoresist layer 20 can be removed through a strip process or an ash process simultaneously. It is noteworthy that after the fin structure 12 within the first region A is partially removed, the height h1 of the fin structure 12 is lower than the height h2 of the insulating layer 14, and a trench 22 is then defined by the top surface of the fin structure 12 and the sidewalls of the insulating layer 14 within the first region A.

Figure 9:
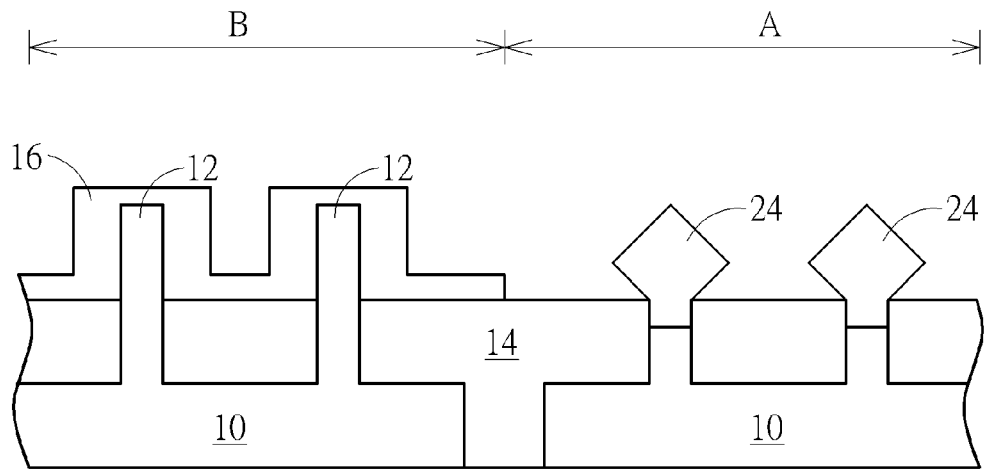

Finally, as shown in FIG. 9, an epitaxial growth process is then performed, to form a plurality of epitaxial layers 24 in each trench 22, wherein the epitaxial growth process may be a molecular beam epitaxy (MBE), a co-flow epitaxial growth process, a cyclic selective epitaxial growth process or other similar processes. Due to the epitaxial layer 24 growing along the inner surface of the trench 22, and only when the epitaxial layer 24 is higher than the height of the insulating layer 14, the epitaxial layer 24 starts to grow outwardly, such as extending upwardly and sideward. In the present invention, the first region A has some trenches 22, so that a portion of the epitaxial layer 24 will be restricted in the trench 22, for avoiding the epitaxial layer 24 over growing and to contact other epitaxial layers 24 disposed adjacent to the one epitaxial layer 24.

Figure 10:
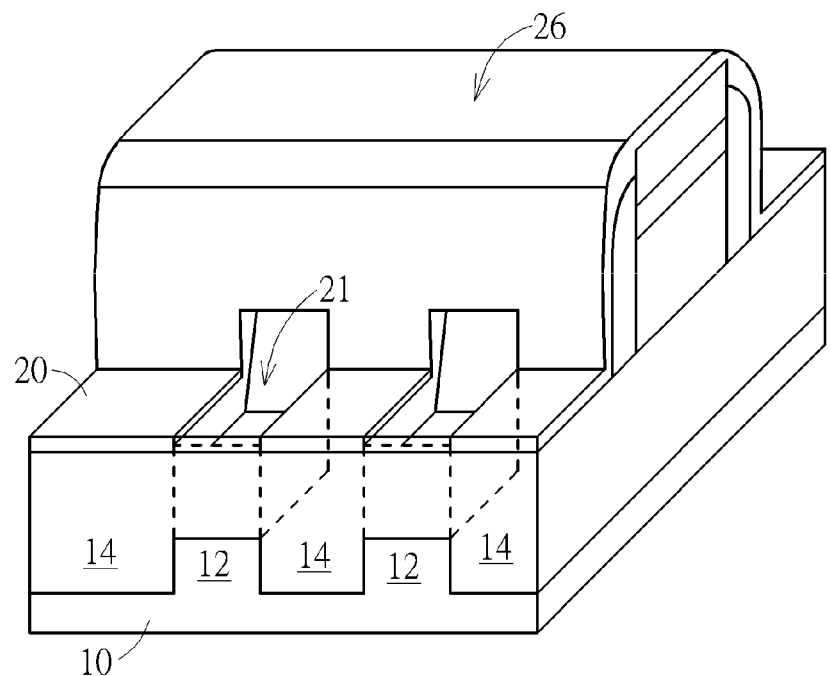
FIG. 10 illustrates the 3D schematic diagram of the semiconductor structure of the present invention.

The present invention can also be applied in transistor device, please refer to FIG. 10, FIG. 10 illustrating the 3D schematic diagram of the semiconductor structure of the present invention. FIG. 10 corresponds the structure within the first region A in FIG. 7, As shown in FIG. 10, a gate process is further performed, and at least one gate structure 26 is formed across the fin structure 12 and so as to form a transistor device. The feature of the present invention is that when the fin structure 12 shown in FIG. 6 is partially removed, the photoresist layer 20 still exists on the surface of the insulating layer 14. In other words, the photoresist layer 20 still covers the surface of the insulating layer 14 that is not covered by the gate structure 26. After the photoresist layer 20 is removed, the epitaxial layer 24 is then formed in the trench 22 (the final structure is shown in FIG. 9). Besides, in the present embodiment, the fin structure 12 and the gate structure 26 are firstly formed, and the fin structure 12 which is not covered by the gate structure 26 is then removed, afterwards, the epitaxial layer 24 is formed. Therefore, the epitaxial layer 24 will not be disposed on the fin structure 12 that is covered by the gate structure 26. However, those flow mentioned above is one of the preferred embodiments of the present invention, and the present invention is not limited thereto. In other words, the gate structure 26 may be formed after the epitaxial layer 24 is formed, it should be comprised in the scope of the present invention.

In addition, It is noteworthy that in the steps shown in FIGS. 5-8, the photoresist layer 20 is formed on the photoresist layer 18 within the second region B, but in another embodiment of the present invention, the photoresist layer 18 can also be removed before the photoresist layer 20 is formed, and the photoresist layer 20 is then formed within the first region A and the second region B. In other words, photoresist layer 20 covers the insulating layer 14 and on each fin structure 12 within the first region A, and covers the dielectric layer 16 within the second region B, this should be comprised in the scope of the present invention. Others details are similar to those is the first preferred embodiment and will not redundantly described here.

Compare with the conventional fin-FET with epitaxial layer, the present invention further forms a material layer, such as the photoresist layer 20 after patterning the photoresist layer 18, the photoresist layer 20 can protect the insulating layer 14 within the first region A from etching, and adjusting the height difference between the fin structure 12 and the insulating layer 14. More precisely, if there is no photoresist layer 20 formed, when partially removing the fin structure 12 within the first region A, the insulating layer 14 disposed on two sides of the fin structure 12 is easily removed too. In that way, the height of the fin structure 12 and the height of the insulating layer 14 are decreased simultaneously, and the trench 22 shown in FIG. 8 cannot be formed. Furthermore, the fin structure 12 may be higher than the insulating layer 14. In that case, since the epitaxial layer is formed along the top surface and the sidewalls of the fin structure 12, without the trench 22 to restrict the growing the epitaxial layer, the epitaxial layer will more easily contact other adjacent epitaxial layers, and influence the performance of the semiconductor device. In short, in the present invention, the fin structure is "buried" in the insulating layer. Therefore the epitaxial layer only forms from the top surface of the fin structure, but does not form from the sidewall of the fin structure.

In summary, the feature of the present invention is that in further forming a photoresist layer during the manufacturing process, the photoresist layer can adjust the height difference between the fin structure and the insulating layer, to make the top surface of the fin structure lower than the top surface of the insulating layer, and a trench is then defined by the fin structure and the insulating layer. Since the following formed epitaxial layer is formed in the trench, the epitaxial layer at least has a portion disposed in the trench, decreasing the possibility to contact the other adjacent epitaxial layers, and increasing the yield of the manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, at least comprising the following steps:
providing a substrate, a first region is defined on the substrate, and the first region comprises a plurality of fin structures, an insulating layer is disposed on the substrate and disposed between the fin structures;
forming a first material layer on the insulating layer, and parts of the fin structures are exposed simultaneously;
removing the fin structures partially;
removing the first material layer completely; and
forming an epitaxial layer on the top surface of each remained fin structure after the first material layer is removed completely.

2. The method of claim 1, wherein after the first material layer is formed, further comprising performing an etching back process to expose the top surface of each fin structure.

3. The method of claim 1, further comprising a second region, the second region comprising a plurality of fin structures, an insulating layer is disposed on the substrate and disposed between the fin structures.

4. The method of claim 3, further comprising forming a cap layer to cover the fin structures and the insulating layer within the first region and within the second region.

5. The method of claim 4, further comprising forming a second material layer on the cap layer.

6. The method of claim 5, further comprising removing the cap layer within the first region.

7. The method of claim 1, wherein after the fin structures are partially removed, further comprising removing the first material layer within the first region.

8. The method of claim 1, wherein after the fin structures are partially removed, the top surface of the fin structure is lower than the top surface of the insulating layer, and a trench is then defined by the first material layer, the insulating layer and the top surface of the fin structure.

9. The method of claim 8, wherein each epitaxial layer at least has a portion formed in the trench.

10. The method of claim 1, wherein every two adjacent epitaxial layers do not contact to each other.

11. The method of claim 1, wherein the first material layer still remains on the insulating layer while the fin structures are partially removed.

12. The method of claim 1, further comprising forming at least one gate structure across the fin structures that are not removed, wherein the gate structure and the epitaxial layer are disposed on different places.

* * * * *